United States Patent
Nair et al.

(10) Patent No.: US 6,366,824 B1
(45) Date of Patent: Apr. 2, 2002

(54) MANUFACTURING REFERENCE DATABASE

(75) Inventors: Bharat B. Nair, San Jose, CA (US); Robert C. Kuzmak, Colorado Springs, CO (US); Larry Barto; Ben Harry, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/190,986

(22) Filed: Nov. 12, 1998

Related U.S. Application Data

(63) Continuation of application No. 09/163,795, filed on Nov. 12, 1998.

(51) Int. Cl.[7] .......................... G06F 19/00; G06F 17/30; G06F 7/00
(52) U.S. Cl. .................... 700/115; 700/19; 700/110; 700/121; 700/221; 700/224
(58) Field of Search .................. 700/121, 96, 108, 700/109, 110, 115, 116, 221, 222, 224, 225, 226, 19

(56) References Cited

U.S. PATENT DOCUMENTS

| | | | | |
|---|---|---|---|---|
| 5,448,488 A | * | 9/1995 | Oshima | 700/121 |
| 5,751,581 A | * | 5/1998 | Tau et al. | 700/115 |
| 5,778,386 A | * | 7/1998 | Lin et al. | 707/10 |
| 5,787,021 A | * | 7/1998 | Samaha | 702/84 |
| 5,847,957 A | * | 12/1998 | Cohen et al. | 700/108 |
| 5,887,176 A | * | 3/1999 | Griffith et al. | 713/320 |
| 5,896,292 A | * | 4/1999 | Hosaka et al. | 700/108 |
| 6,038,486 A | * | 3/2000 | Saitoh et al. | 700/96 |
| 6,055,463 A | * | 4/2000 | Cheong et al. | 700/223 |
| 6,115,643 A | * | 9/2000 | Stine et al. | 700/110 |
| 6,192,291 B1 | * | 2/2001 | Kwon | 700/121 |
| 6,256,549 B1 | * | 7/2001 | Romero et al. | 700/121 |

* cited by examiner

*Primary Examiner*—William Grant
*Assistant Examiner*—Paul Rodriguez
(74) *Attorney, Agent, or Firm*—Williams, Morgan & Amerson, P.C.

(57) ABSTRACT

An system and method of tracking and coordinating distribution of manufacturing reference information that represents movement of devices throughout a plurality of manufacturing facilities at remote locations. The approach is particularly advantageous in application environments wherein a manufacturer has multiple manufacturing facilities. One embodiment of the method of tracking involves the steps of assigning codes that include a test flow indicator to the devices to identify information, processing devices according to the test flow indicator, receiving processing development data in near real-time at each of the remotely located facilities, utilizing a Manufacturing Reference Database to aggregate manufacturing information by receiving the manufacturing information data from remotely located facilities on a transaction-by-transaction basis, storing and then transmitting the manufacturing information to other corporate systems communicating with the Manufacturing Reference Database in near real-time.

15 Claims, 4 Drawing Sheets

US 6,366,824 B1

MANUFACTURING REFERENCE DATABASE

This is a continuation of application Ser. No. 09/163,795, filed Nov. 12, 1998.

FIELD OF THE INVENTION

The present invention relates generally to a system and method for tracking movement and production of semi-conductor devices at remotely located facilities within a world wide semi-conductor device manufacturing operation, and more particularly to a system that intelligently communicates the semi-conductor device manufacturing reference information to other corporate information systems in near real-time for use in accomplishing overall semi-conductor device manufacturing business objectives.

BACKGROUND OF THE INVENTION

Large manufacturing companies typically have multiple manufacturing and storage facilities in geographically disbursed locations. Implementing a manufacturing tracking system that will track the overall manufacturing process in this type of a distributed manufacturing facilities arrangement is often difficult and ineffective. Traditionally, manufacturers have implemented stand alone computer implemented manufacturing tracking systems in each of its manufacturing facilities. Each of these systems function independent of the other tracking systems located at other manufacturing facilities. One of the problems associated with this kind of arrangement is that the individual tracking systems are not communicating with each other, nor are they coupled with other corporate systems in order to facilitate company and system-wide integration of manufacturing process information.

The lack of integration and coupling of the tracking systems at each manufacturing facility has serious drawbacks. For example, a large corporation having multiple manufacturing facilities needs to track the materials and products being manufactured in all of its facilities simultaneously. The information concerning materials or products manufactured in one facility may be relevant to materials and products being manufactured in another. The information from both facilities is relevant to the overall manufacturing strategy and how the combined manufacturing capacity of both facilities can be used to accomplish the overall business process. There is a need for a tracking system that integrates each stand alone system into a centralized manufacturing reference system that communicates with other corporate systems in order to assist in faster accomplishment of the overall business process.

Although there are currently computer implemented tracking systems that communicate the activities of product and material manufacture occurring at remote locations into other corporate systems, such systems lack the ability to seamlessly communicate the tracked manufacturing information to coupled corporate systems in a timely, organized and intelligent manner. There is a need for a system that can seamlessly communicate the tracked manufacturing information to the coupled corporate systems immediately upon request. The information communicated needs to be limited to only the information that is relevant to the corporate system or user requesting the information.

A prior art system arrangement which integrates remote stand alone device tracking systems into additional corporate systems is shown in FIG. 1. This integrated system refers to the system that tracks product, material production and other engineering data collected in remote facility locations using the WorkStream system. As the system architecture shown in FIG. 1 illustrates, there are systems that work directly against the WorkStream system, systems that work off of other systems that work off the WorkStream system, and systems that work off extracts that work off of the WorkStream system. The problem with this type of system architecture occurs from a systems and technology perspective. There are a myriad of technologies utilized amongst the individual systems that are communicating with the WorkStream system. For example, the WorkStream system may be a VAX/VMS platform, wherein the WorkStream database is an operational database running on DBMS, whereas the other stand-alone systems communicating with WorkStream may be operating on an Oracle database running on a Sun Server, or a Microsoft Access based application on a file mounted system on a Sun server. These stand alone systems or extracts also include databases of varying types, including, historical, financial, engineering analysis and operational information. Because of the prior art system architecture, all of the systems illustrated, which need data from the WorkStream system database to track information generated by the manufacturer's product tracking system concerning information about products and materials being manufactured in a manufacturer's facility, will not receive data at the same time. In addition, the significant use of historical data by the systems communicating with the WorkStream system leads to significant challenges when running the overall system in a manufacturing environment.

In addition, FIG. 1 illustrates that there are several systems within the prior art architecture that forward data received from the WorkStream system to other systems. For example, engineering data analysis system 122 is an extract that goes directly against the WorkStream system. The engineering data analysis system 122 forwards data it receives from the WorkStream system database to other systems. Similarly, extract 120 which is also directly interfaced with the WorkStream system forwards data received from the WorkStream system database to other systems. The multi-level communication and indirect routing of data within the overall system complicates the understanding of changes or improvements that occur on the floor of the manufacturing facility. Changes such as customizing the WorkStream system or enhancing the functionality of the WorkStream system are difficult to understand, because the down stream cascading effects on other systems resulting from changing the WorkStream system are not readily apparent.

The difficulty with the configuration of the product and material tracking system shown in FIG. 1 is that the platforms upon which each individual system that the WorkStream system communicates with is built, may include HP/UX, SUN/SOLARIS, VAX/VMS, RDB, VAX/DBMS, Oracle, or IBM Mainframes. All of these systems, some of which are not illustrated in FIG. 1, would be interacting or working in a heterogeneous environment from a technology perspective. Therefore, manufacturing changes that have to be made in order to satisfy the company's business objectives or the company's business needs are faced with tremendous challenges. These challenges result from the need to identify and perform an analysis of what the impact of making such changes would be on system information down stream from the WorkStream system. In many instances, because of the varying platforms, the modifications are not capable of being communicated across all systems and extracts and must be retrofit. In addition, the prior art system architecture is further complicated because there is a stand alone WorkStream system in operation at each particular location in a manufacture's network of facilities. Therefore, for example, a year-end audit for inventory tracking, or a year-end audit for financial accounting practices, requires the consolidation of all the information in each WorkStream system at each facility location. This is a very cumbersome and labor intensive process for the Mainframe system. There is a need for a system that resolves the problems caused by the prior art system architecture.

Another problem resulting from the architecture of the prior art system described in FIG. 1, is that at any point in time, individuals at remote locations could have a situation where they are viewing a particular type of data and see two different data results at that point in time if the view into the system is done at two different points. Whether this data inconsistency is caught depends on when the particular extract or system the individual is accessing information through receives data from the WorkStream system database. There is a need for a system that collects and centralizes data from the individual stand alone WorkStream systems and coordinates distribution of all manufacturing reference data to the appropriate remote location systems at the appropriate time. The configuration of the prior art system shown in FIG. 1 does not allow for this level of coordinated interaction and thus results in data being communicated to different databases at different times, resulting in data inconsistencies.

An additional problem that results from the architecture of the prior art system described in FIG. 1 is that the WorkStream system database is required to store information for extended periods of time in order to satisfy manufacturing process historical reporting. This is problematic and causes the WorkStream system processing to slow down because of the large amounts of data that must be maintained to support historical requests. There is a need for a system that transfers data out of the WorkStream system database immediately following its shipment from the WorkStream system database. Such a system would thereby transfer the responsibility of historical reporting away from the WorkStream database so that the WorkStream system would only be responsible for timely tracking and transference of production information regarding products and materials within a manufacturing facility.

SUMMARY OF THE INVENTION

According to the invention, a system and method for tracking movement of devices, such as integrated circuits, at remotely located facilities, wherein the method is implemented by performing a plurality of steps. In the first step, codes are assigned to the devices to identify product information, including the manufacturing facility, the device type, lead characteristics of the devices and at least one test flow indicator that is used to direct testing of the devices. In the second step, the devices are processed according to the process steps, defined in the system. In response to the step of processing, the system receives processing data in near real-time at each of the remotely located facilities. In response to the step of receiving processing data, the system's Manufacturing Reference Database aggregates manufacturing process information. The manufacturing process information includes quantities of the devices processed, based on multiple levels of product groupings according to the codes assigned to the respective devices. The aggregation of manufacturing process information is accomplished by receiving manufacturing process information from remotely located facilities on a transaction-by-transaction basis, storing and then transmitting the manufacturing process information to other corporate subsystems in near real-time.

The above summary of the present invention is not intended to describe each step in the method or all functionality of the Manufacturing Reference Database (MRD) system utilized in the present invention. The figures in the detailed description which follow more particularly exemplify the embodiments.

BRIEF DESCRIPTION OF THE DRAWINGS

The invention may be more completely understood in consideration of the detailed description of the embodiments of the invention which follows in connection with the accompanying drawings, in which.

Figure 1:
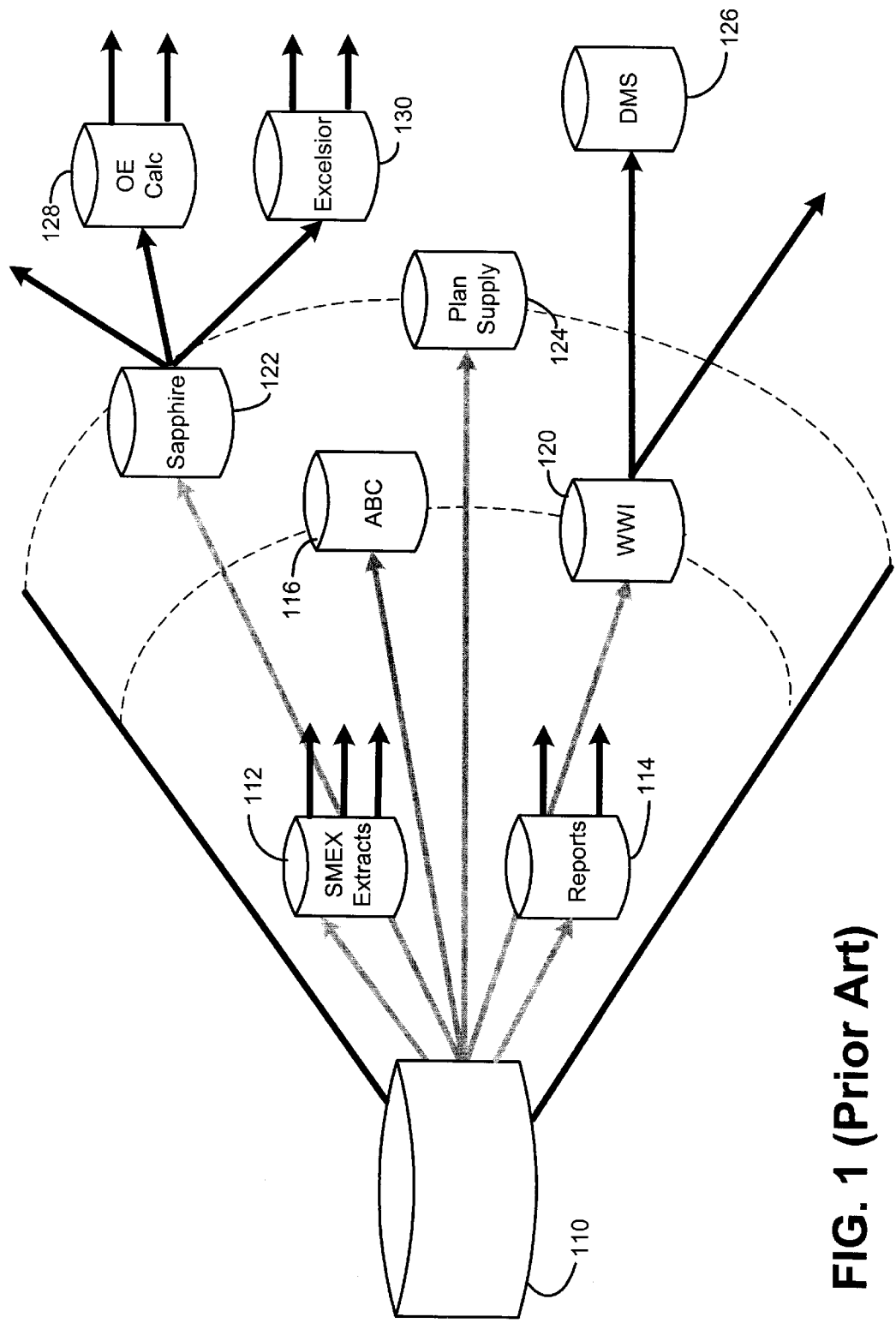
FIG. 1 represents an example of a prior art embodiment of a manufacturing tracking system.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims. It is also envisioned, as an embodiment of the invention, that manufacturing information, related to the company's semi-conductor devices, manufactured across the globally-distributed manufacturing facilities, is readily available for use, in the form of simple and complex reports aggregation, summarization, and a multitude of cross-tabbed, cross-related entities, in a contemporaneous, homogenous technology platform.

DETAILED DESCRIPTION

The present invention is a method and system for tracking and coordinating distribution of manufacturing reference information regarding the manufacture of semi-conductor devices throughout a plurality of manufacturing facilities at remote locations. One type of semi-conductor device in the manufacturing environment on which this method and system would have tremendous application is the integrated circuit.

In the manufacturing environment for integrated circuits, the manufacturer uses the present invention to track integrated circuits being manufactured at multiple facilities throughout the manufacturing process for several reasons. One reason is to make sure that requests for the manufacture of integrated circuits or materials used to construct integrated circuits is synchronized with the overall business strategy for manufacturing integrated circuits. Another reason the information is tracked is to provide a means for trouble shooting problems that are occurring in the manufacturing process.

The present invention is a system that coordinates and transmits, in near real-time, status and condition information regarding integrated circuit devices in the process of being manufactured at remotely located facilities. The system is comprised of a plurality of tracking systems, a Manufacturing Referenced Database (MRD) storage architecture and at least one processing unit coupled to the Manufacturing Reference Database and tracking systems. During the manufacturing process, the system tracks each individual integrated circuit device in order to determine its status and condition, receives and stores information in near real-time regarding the status and condition of the integrated circuit devices recorded by the tracking systems within each of the remotely located facilities, and aggregates the status and condition information in accordance with a predefined aggregation protocol. The system also transmits select packets of information regarding status and condition of the integrated circuit devices in response to information requests from other business systems coupled to the system.

Integrated circuit devices being manufactured are tracked by the system comprising the present invention by codes that are assigned to the integrated circuit devices. These codes identify at least the type of integrated circuit, where the circuit was manufactured and the integrated circuits attributes, including its lead characteristics and a testing procedure. All of this information is necessary for system wide understanding of supply and manufacturing demand in the integrated circuit environment. This data is also critical to manufacturing facility system wide coordination of integrated circuits and the ability to satisfy orders.

Part of the equation to understanding what types of integrated circuits are available is knowing which of the integrated circuits manufactured are in working condition. Working condition is determined by testing procedures implemented by the tracking system in accordance with the test flow indicator which defines the point during the manufacturing process wherein the predefined testing procedure for the particular integrated circuit is to be performed. There are a number of tests that can be performed on integrated circuits in the manufacturing environment. For example, one type of test that may be directed by the system is for a batch of integrated circuits to have testing signals input into each integrated circuit and performing a comparison of the output of the integrated circuit with a predefined output that should occur if the integrated circuit is performing properly. Another type of test that could be performed is a power up test, wherein the integrated circuit is powered up and leads are checked to determine if the appropriate outputs are being transmitted from the leads. The system could also direct the application of inputs to the integrated circuit in order to check for shorts in the integrated circuit leads. There are a number of other integrated circuit tests which could be performed on the integrated circuits during the manufacturing process. The specific types of tests that are performed on the integrated circuits are predefined and stored in system memory. The exact test performed on an integrated circuit is determined by the type of integrated circuit being manufactured at a particular facility and is also determined, by the stage in its manufacturing cycle, when the test is performed.

In the manufacturing environment, it is critical to know the types of integrated circuits that are available for use and how many are in the process of being manufactured at each manufacturing location for purposes of satisfying orders world wide. Although prior art systems have been able to track this information, it has never been tracked in near real-time during a manufacturing run. In the past, this type of information would be batch downloaded following completion of a manufacturing run. The present invention tracks manufacturing information and transmits that information in near real-time to systems coupled to the tracking system that can use the information to increase system wide manufacturing efficiency.

Figure 2A:
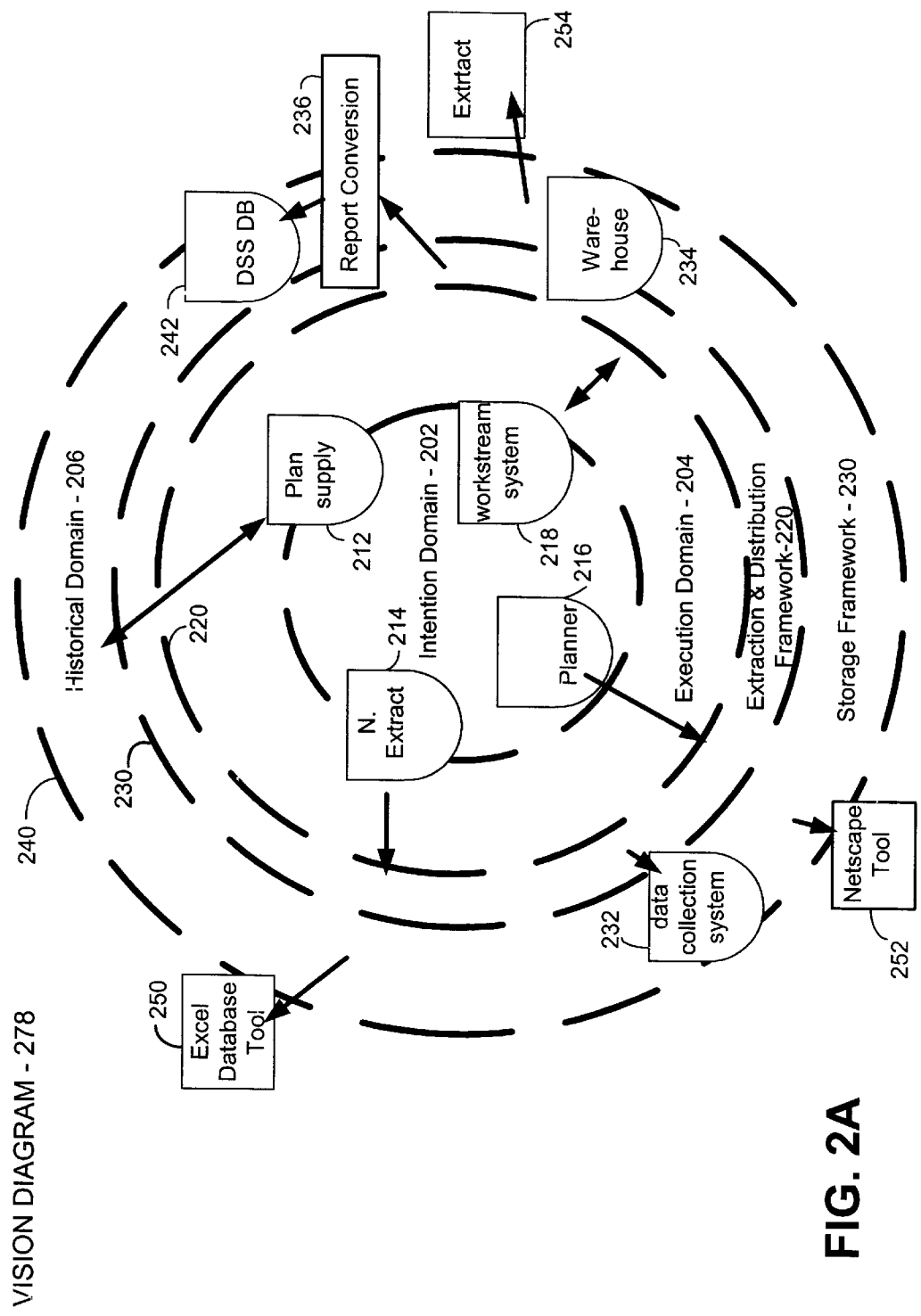
FIG. 2a is a block diagram illustrating a three dimensional representation of the system for tracking movement of devices integrated by a Manufacturing Reference Database system architecture according to an embodiment of the present invention.
Figure 2B:
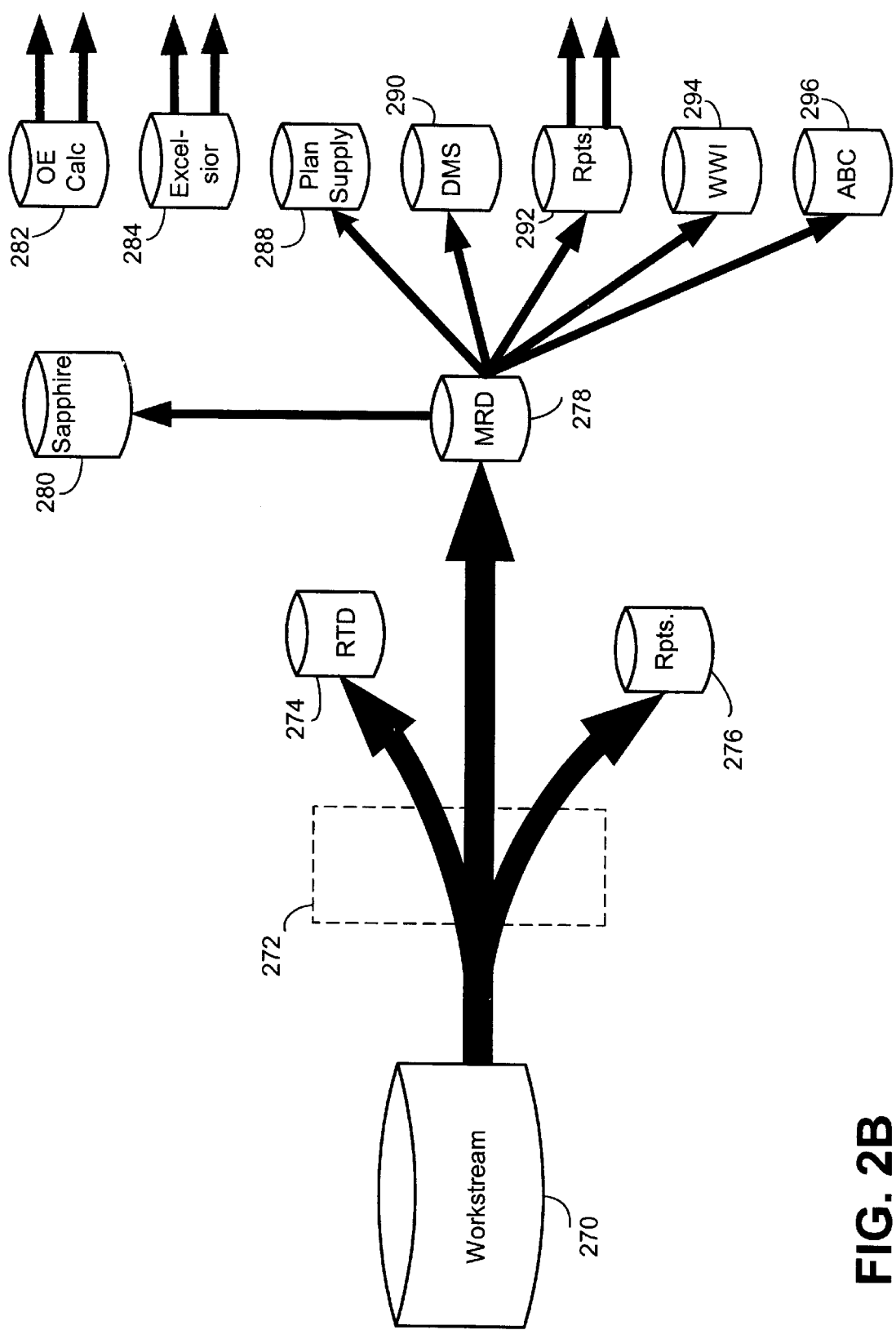
FIG. 2b is a block diagram illustrating the interactivity of the separate database systems with the system for tracking movement of devices and the Manufacturing Reference Database according to an embodiment of the present invention.

An embodiment of the architecture of the system for tracking and coordinating distribution of manufacturing process reference information throughout a plurality of factories at remotely located facilities is shown in FIG. 2b. FIG. 2b is also illustrative of the Manufacturing Reference Database system's 278 connectivity to a plurality of other systems and extracts 280, 282, 284, 288, 290, 292, 294, 296 and the manufacturing tracking system (referred to as the WorkStream system) 270. As FIG. 2b illustrates, Manufacturing Reference Database system 278 coordinates the distribution of manufacturing reference information to other corporate systems and users, globally.

In the embodiment of the system shown in FIGS. 2a and 2b, the Manufacturing Reference Database system 278 is a Sun/Solaris based platform running an Oracle database. It acts as the central coordinator of manufacturing reference information for all of the other systems and extracts integrated in the manner shown in FIGS. 2a and 2b. In system operation, the Manufacturing Reference Database system 278 receives and stores information regarding products and materials in the manufacturing process from the WorkStream system 270 on a transaction-by-transaction basis in near real-time. The WorkStream system 270 includes a VAX/DBMS hierarchical database or an Informix relational database. Following storage of information, the Manufacturing Reference Database system 278 coordinates transmission of the appropriate stored information to the appropriate networked system or extract.

The architecture of the system for tracking and coordinating distribution of manufacturing process reference information shown in FIG. 2B enhances the systems ability to intelligently distribute information to the appropriate corporate system or extract at the appropriate time. This is a critical function because the information that is received by the different systems and extracts that the Manufacturing Reference Database system 278 transmits data to may be time dependent. In contrast, because of the prior art system architecture shown in FIG. 1, at any point in time, it is possible to have a situation where an individual attempting to review the same information in two separate systems coupled to the prior art system may see two different things. This occurs because the prior art system's architecture does not provide for simultaneous near real-time coordinated data transmission to each networked system or extract. In contrast, the Manufacturing Reference Database 278 provides the ability for the WorkStream 270 tracking system to make appropriately timed and coordinated data transmission to multiple networked systems and extracts. This function adds consistency and reliability in the data being transmitted to the individual system or extract, with respect to any particular product, material, procurement thereof or status information regarding the manufacturing process.

FIG. 2a which is illustrative of the Manufacturing Reference Database structure also illustrates system wide integration of the tracking system and the other systems that are networked to the Manufacturing Reference Database 278 in a three-dimensional format. The systems coupled to the MRD system and the fields within the Manufacturing Reference Database system illustrate the functionality of the system across the entire manufacturing process, which is controlled by three primary domains. The first domain is the intention domain 202. The intention domain 202 is where the Manufacturing Reference Database system 278 defines the need to build a particular product in a manufacturing environment. The intention domain 202 is also where the basics of a particular product's definition, product research, product bill of materials, process configuration, route configuration and other basic product elements are all stored. The intent to manufacture is also being defined in the intention domain 202.

After the intention domain 202 has been fully defined, the execution domain 204, which surrounds the intention domain 202, executes the intention components defined in the intent domain 202. Surrounding the execution domain 204 is the historical domain 206 which configures data so that the intention domain 202 and the execution domain 204 can be historically tracked. Data stored within the historical domain 206 provides the user of the system for tracking and coordinating distribution of manufacturing reference information with the ability to improve its manufacturing processes and capabilities.

FIG. 2a also illustrates the manner in which the separate systems and extracts that interact with the Manufacturing Reference Database system 278 have data communicated thereto. Each individual system or extract and their components straddle the intention 202, execution 204 and historical 206 domains in order to enhance manufacturing systems integration. In order to facilitate integration of the different systems that straddle these domains, the Manufacturing Reference Database system 278 utilizes an extraction and distribution framework 220, which provides the technological framework that affords the different systems and extracts with the ability to intersect multiple domains.

The extraction and distribution framework is also shown in FIG. 2a. It illustrates the manner in which data is extracted from a first location in the system and distributed to another system in another location in near real-time for another user at the other location to utilize the extracted data. In addition to extracting and distributing data from a first location to a second location in near real-time, the Manufacturing Reference Database system 278 has an intelligent storage framework 230 which is comprised of a predefined method of storing the information to be transmitted and a precomputed mechanism for transmitting the information in an intelligent way to the appropriate locations.

The Manufacturing Reference Database system 278 architecture also includes an access framework 240 which defines the methodology for giving access to the information transmitted to individuals seeking information from the computer system that have the appropriate security level and the right privilege at the right time. Another important and critical aspect of the configuration of the Manufacturing Reference Database system is that none of the frameworks, execution and distribution 220, storage 230, and access 240, nor any of the domains, intention 202, execution 204, and historical 206 are locked into a particular technology or tool. This aspect of the Manufacturing Reference Database system's configuration makes it amenable to being a true plug and play system that can adapt to changing technology and changing manufacturing needs and changing systems.

Another system illustrated in FIG. 2a which straddles multiple domains within the Manufacturing Reference Database system is the engineering data collection system 232. In addition, the WorkStream system 218, which includes the WorkStream databases and the WorkStream operational systems that reside in different areas, straddles the intention domain 202, the execution domain 204, and the historical domain 206. The WorkStream systems 218 straddle multiple domains because its components are used to configure the process by which the factory product and manufacturing material flows. The WorkStream systems' configuration also defines routes in the factories, the operations, product flows and parameters of the product and manufacturing material. This functionality primarily falls in the intent to manufacture domain 202. However, WorkStream systems 218 are also used to track manufacturing materials flowing through the different routes and different operations of the manufacturing process which falls into the execution domain 204. This illustrates why the WorkStream systems 218 straddle the intention domain 202 and the execution domain 204. Similarly, the Plan Supply system 212 straddles the intention domain 202 and the execution domain 204. This is necessary because, in order for the manufacturer to plan what needs to be built or what needs to be manufactured in a particular factory, it needs to have a clear understanding and grasp of what products are already there. In some instances the manufacturer will need to have access to this information in as short a period of time as twenty-four hours or less. In the execution domain 204, Plan Supply 212 has knowledge of what has been manufactured, how it was manufactured, how long it took to manufacture and what was yielded. WorkStream systems 218 also use information from the historical domain 206 in order to project what needs to be built.

The nomenclature extract 214 defines the bill of materials function and the naming constructs of the different components that need to be built. It also straddles the intention domain 202 and the execution domain 204. The process planner system 216 which defines the process technology that a particular product is intended to be manufactured with also straddles the intention domain 202 and the execution domain 204. For example, 0.5 micron technology, 0.35 micron technology or 0.25 micron technology that is used to manufacture integrated circuit products is defined by the process planner system 216.

FIG. 2a also illustrates additional systems and extracts 234, 236, 242, 250, 252 and 254 that can be integrated with the Manufacturing Reference Database. The ability for these systems and extracts to interact, each on their own platforms, illustrates the Manufacturing Reference Database system's ability to make the system for tracking and coordinating distribution of manufacturing reference information throughout a plurality of factories a true plug and play configuration. This configuration provides the ability to include future technology components, thereby enhancing the system for tracking and coordinating distribution of manufacturing reference information. For example, DSS DB 242, which stands for Decision Support Systems Databases, could be an Oracle based, small database called a Datamart, for aggregation or summarization of a particular type of product grouping. Decision Support Systems databases are intelligent and can correlate data from different points of seemingly unrelated areas. An example of how a decision support system database could be used is in the context of a group of executives who are only interested in finding out information on products for which they are responsible. The database could be a Datamart database system which basically aggregates information about all of the product lines the executives are responsible for throughout the corporation. The system would have the information reside in, for example, DSS DB1, which represents one particular product line. Similarly, there could be a decision support system database for a process technology such as the 0.25 micron technology or the 0.50 micron technology. Or, another example would be a decision support system database that tracks subcontractor manufacturing data and information related to subcontractor manufacturing and their process improvements thereupon.

The Report conversion tool 236 is another set of ad hoc or pre-computed tools that typically works against different databases or could work against the extraction and distribution framework 220. This tool creates custom reports and ad hoc reports regarding the manufacturing process. This tool could also work against the Decision Support Systems databases to generate on-line and ad hoc reports for consumption by different individuals.

Other tools include the Corporate warehouse database system 234, the Netscape tool 252 and the Excel database tool 250. The Corporate warehouse database system 234 is the Manufacturing Reference Database tool that consolidates data for multiple locations. The Netscape 252 and Excel database 250 tools are two desktop tools that may be heavily utilized in end user data consumption.

Referring to FIG. 2b, the system for tracking and coordinating distribution of manufacturing reference information system architecture is defined. This architecture is a significant improvement over the prior art manufacturing tracking system illustrated in FIG. 1. The architecture illustrated in FIG. 2b illustrates that the system reduces the reliance for data retention and access on operational systems such as the WorkStream database system 270. It also provides the manufacturer with the ability to better understand and comprehend the impact of changes to manufacturing material processing information downstream. It also, in accordance with FIG. 2a, provides the ability to aggregate different types of information in intelligent Datamart databases, or other mechanisms of data manipulation and consolidation.

In order to facilitate the interaction of intelligent Datamart databases and data manipulation as illustrated in FIG. 2a, in accordance with the system architecture shown in FIG. 2b, WorkStream database system 270 is isolated and stands alone as a true and pure tracking system that tracks work in progress on the factory floor of a manufacturing plant. This type of architecture relieves the WorkStream database 270 of the responsibility for retention of historical data and other report generation responsibilities. As data is tracked by the WorkStream database system 270 or as material moves within the WorkStream database system 270 within the factory floor environment, that information is captured in near real-time as it happens. The WorkStream database system 270 transmits this data to the Manufacturing Reference Database system 278 in near realtime for transmission and storage. The Manufacturing Reference Database system 278 has the responsibility for transmitting the captured information to the subsequent systems and other types of data mechanisms or data aggregation tools such as Datamart databases, Excel 250 and Netscape 252, or to the corporate warehouse 234, the engineering data collection/engineering analysis system 232 and other types of systems. FIG. 2b illustrates that the other systems and extracts include, OE calc 280, Excelsior 284, Plan Supply 288, Distribution Management System 290, Reports 292, World Wide Inventory 294, and Activity Based Costing 296. The Manufacturing Reference Database 278 also controls storing historical data and stores such data in an intelligent way in order to provide information about the factory manufacturing process to other systems and individuals within an organization.

Regarding the systems and extracts within the system, OE Calc system 282 is a system for performing calculations on the engineering data received from engineering data collection/engineering analysis system 232. The Plan Supply system database 288 includes information regarding what has been manufactured, how it was manufactured, how long it took to manufacture and what was yielded. The Distribution Management system 290 is a worldwide distribution system that tracks and facilitates the shipping environment for the products and materials. The Reports system 292 is a tool that creates custom reports and ad hoc reports regarding the manufacturing process. The World Wide Inventory system 294 is an acquisition program that runs on a periodic basis in order to collect data and transform the data collected into a form for storage. The Activity Based Costing system 296 is a series of programs that extract data from the manufacturing floor in order to track product movements and the time a product spends in a particular operation in order to perform the costing function.

The structure of the system for tracking and coordinating distribution of manufacturing reference information has special significance in a multiple manufacturing facilities environment. The system's Manufacturing Reference Database system 278 can receive and coordinate manufacturing reference data received from multiple facilities on a transaction-by-transaction basis in order to transmit logical and intelligent data packages to the appropriate systems or extracts communicating with the Manufacturing Reference Database system 278.

The near real-time dispatch system 274 (RTD) and the reports system 276 are two other systems that are driven off the same extractor from the WorkStream database system 270. Real time dispatch system 274 and reports system 276 run the factories at the execution and dispatch levels. These systems are illustrated to indicate the correlation between near real-time dispatch, the Manufacturing Reference Database system 278 and reporting on the extracting tool 272.

Figure 3:
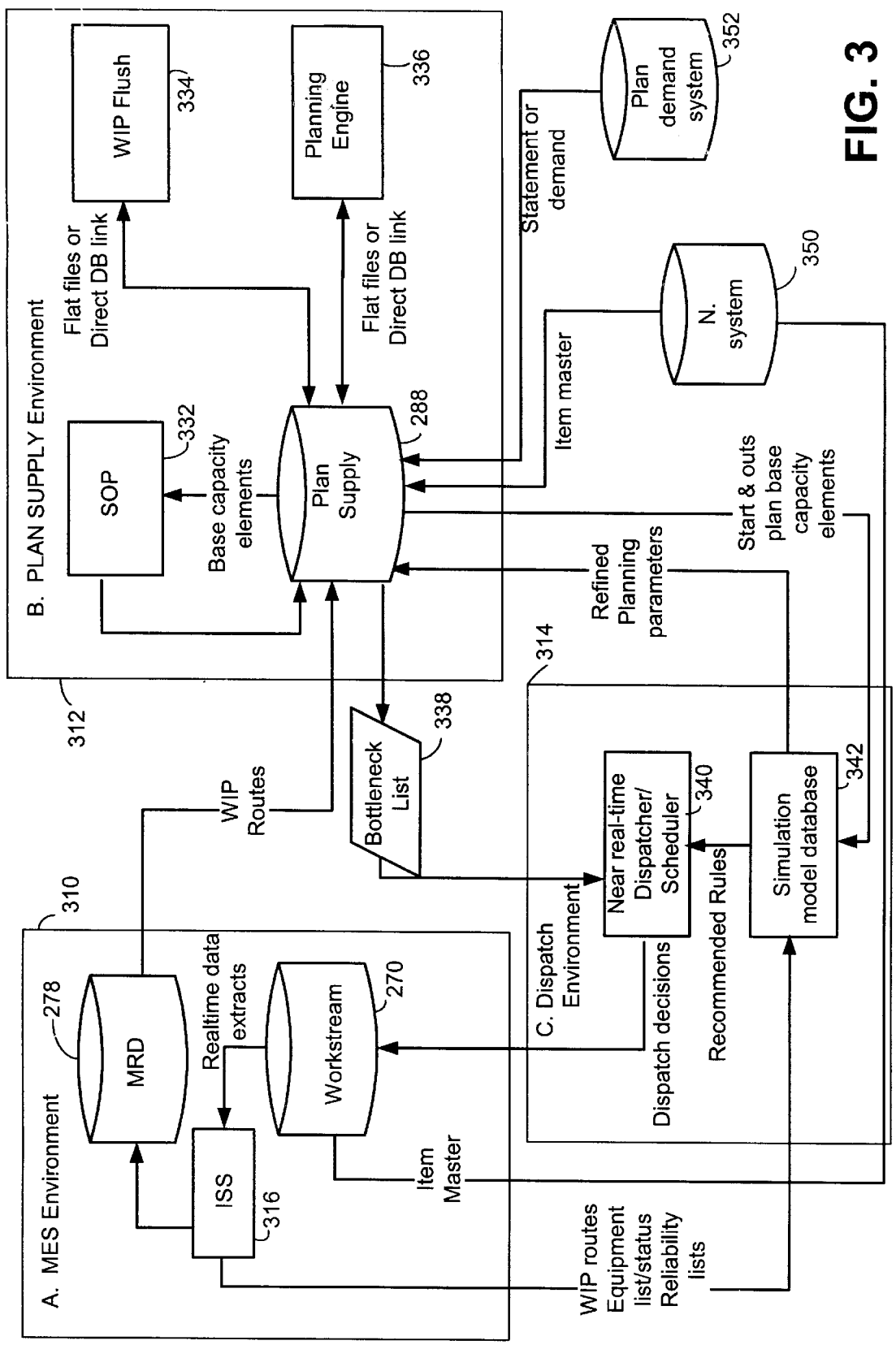
FIG. 3 is a block diagram illustrating an embodiment of the system for tracking movement of devices, including a Manufacturing Reference Database system, illustrating integration architecture of the present invention.

FIG. 3 illustrates the architecture of the system for tracking and coordinating distribution of manufacturing reference information on a large scale factory systems integration level from an overview perspective. FIG. 3 also designates and identifies the integration points and the components that tie factory and corporate systems together at a high level. It also illustrates the Manufacturing Reference Database system's 278 importance in the overall long term systems integration strategy for a company having multiple manufacturing facilities.

The system integration architecture has three major components. Block A 310, block B 312, and block C 314. Block B 312 illustrates the Plan Supply environment, which includes the Plan Supply data base 330 (also referenced in FIG. 2a as 212 and 2b as 288). The Plan Supply database 330, which in this embodiment is an Oracle database, is responsible for defining and generating an enterprise-wide plan regarding what needs to be manufactured. The plan is defined all the way from the front end of the manufacturing process to box stock. The plan takes demand and nets out inventory and work in progress and performs enterprise-wide planning on a daily and weekly basis. Weekly planning is for the enterprise. Daily planning is for the back end facility. In order to generate an enterprise wide plan, the Plan Supply database 330 needs information from the Nomenclature system 350 (also referenced in FIG. 2a as 214) which identifies the bill of material and item master structure. The Plan Supply database 330 also needs a statement of demand from the Plan Demand system 352, which is a sales forecasting system. The Plan Supply database 330 utilizes the statement of demand from the Plan Demand (sales forecasting) system 352 and information from the Manufacturing Reference Database 318 (also referenced as FIG. 2a and 2b as 278) and other subsystems as illustrated in FIG. 3. The Plan Supply database 330 processes all incoming information in order to track actual activities on the factory floor. It also utilizes this information to create a starts and outs plan which is transmitted into the dispatch environment 314, specifically into the simulation model 342. The simulation model 342 receives the starts and outs plan from the Plan Supply database 330, and at the same time receives input from the Manufacturing Reference Database 318 regarding what is actually happening on the floor of the manufacturing facility. In combining these two pieces of information, the simulation model 342 uses the rules previously defined in the model to identify how to dispatch specific material onto the factory floor. The combined data is processed by the near real-time dispatcher/scheduler 340 in order to make dispatching decisions. The near real-time dispatcher/scheduler 340 makes dispatch decisions and forwards those decisions to the WorkStream database 320. The WorkStream database 320, which has responsibility for execution as identified in FIG. 2*a*, executes decisions which were based on the models defined in the simulation model database 342, that were created and based on a plan set forth in the Plan Supply database 330, which was based on the sales forecasting that was input by the plan demand database 352. Once the WorkStream database system 320 begins to execute, the Manufacturing Reference Database 318 tracks those executions and feeds that information directly into the Plan Supply database system 330 on a transaction-by-transaction basis. The Plan Supply database 330 is always aware of exactly how instructions are being created by the database and executed by the intelligent engine.

Referring back to the Plan Supply environment 312, which comprises full enterprise-wide planning, the SOP 332 calculates the base units per hour. This calculation is performed by equipment, by operation, by factory and by product. It is critical that the Plan Supply database system 330 know exactly how many products can be made by particular equipment. The work in progress flush system 334 receives all material on the factory floor and flushes it to the next inventory point in order to consume capacity before it allocates free capacity for new products and new material. The work in progress flush system 334 reports back unused capacity at different operations and different equipment to the Plan Supply database 330 which then reallocates unused capacity.

For example, in the Plan Supply environment 312, if a request is made to a manufacturer to build 10,000 units in a particular day at a particular manufacturing facility operation, but machines go down and there are only 1,000 units actually built, the system has to make up for the 9,000 units or adjust the demand and communicate the situation back to the customer. In order to do that, Plan Supply database 330 must have information regarding the system's inability to manufacture products communicated back to it immediately so that the information can be relayed back to the Manufacturing Reference Database 318.

In the context of the systems integration architecture, the Manufacturing Reference Database system 318 is in a manufacturing execution system's environment. It is the central focus of providing near real-time data to the various systems. The Manufacturing Reference Database system 318 controls near real-time data transmission by providing data to the dispatching environment 314 and the simulation model 342 through ISS software 316. The ISS software 316 provides work in process, routes, equipment lists, equipment status and reliability data. That information is received by the simulation model 342 which makes near real-time execution and dispatching decisions on the factory floor in the manufacturing environment. The Manufacturing Reference Database system 318 also transmits data into the Plan Supply database 330 in near realtime regarding how material has continued to move on the factory floor. This is done so any last minute problems that happen on the factory floor are communicated through the system, into the Plan Supply database 330.

What is claimed is:

1. A method for tracking movement of integrated circuit devices at remotely located facilities during a manufacturing process, comprising:

assigning at least one code to the devices to identify information including the manufacturing facility, the device type, lead characteristics of the devices and at least one test flow indicator used to direct testing of the devices;

processing the devices including testing according to the test flow indicator;

receiving processing data in real time at each of the remotely located manufacturing processing facilities in response to said processing during the processing of the devices; and aggregating manufacturing information relating to processing the devices using a Manufacturing Reference Database, said manufacturing information comprising quantities of goods of the devices processed, based on multiple levels of product groupings according to the codes assigned to the respective devices.

2. A method of coordinating and transmitting in near real-time manufacturing status and condition information regarding integrated circuit device in the process of being manufactured at remotely located facilities during processing of the integrated circuit, using a system comprising a plurality of tracking systems, a memory arrangement and at least one processing unit coupled to the memory arrangement and tracking system, the method comprising:

tracking each individual integrated circuit device during the processing of the integrated circuit in order to determine its status and condition;

receiving and storing in near real-time information regarding the status and condition of the integrated devices recorded by the tracking system within each of the remotely located manufacturing processing facilities;

aggregating the information regarding status and condition of the integrated circuit devices in accordance with the predefined aggregation protocol; and transmitting select packets of information regarding status and condition of integrated circuit devices in response to information requests from the systems coupled to the processing unit.

3. The method of claim 2 wherein the receiving and storing step further comprises the step of receiving and storing status and condition information for each transaction of information tracked in near real-time.

4. The method of claim 2 wherein the receiving and storing step further comprises the step of storing information received in an organized format in accordance with a predefined data storage protocol.

5. A system for tracking status of integrated circuit devices during a manufacturing process at remotely located facilities, wherein the integrated circuit devices have codes assigned thereto for identifying integrated circuit type, integrated circuit leads characteristics, and an integrated circuit test flow indicator, the system comprising:

a manufacturing facility product tracker, information regarding status of integrated circuit devices during the processing of the integrated circuit;

a receiver coupled to the manufacturing facility product tracker for receiving information regarding the manufacturing status of the integrated circuit devices in real-time;

a memory arrangement for storing information regarding the manufacturing status of the integrated circuit devices, wherein the information regarding the manufacturing status of integrated circuit devices includes a plurality of data elements;

a processor coupled to the manufacturing facility product tracker, to the receiver and to the memory arrangement, said processor being configured to at least:

control transmission of data from the manufacturing facility product tracker to the receiver; and coordinate distribution of the information regarding the manufacturing status of integrated devices in response to request for specific information regarding the manufacturing status of integrated circuits.

6. A system for tracking status of integrated circuit devices as recited in claim 5 wherein the processor and receiver are further configured to receive information from the product tracker in near real-time for each transaction of information tracked.

7. A system for tracking the status of integrated circuit devices as recited in claim 5 wherein the processor is further configured to cause the information regarding the manufacturing status of the integrated circuit devices to be stored in the memory arrangement in an organized format in accordance with predefined data storage protocol.

8. A system for tracking the status of integrated circuit devices as recited in claim 5 wherein the processor is further configured to generate customized reports including select information from the information regarding the manufacturing status of the integrated circuit in response to a customer request.

9. A system for tracking status of integrated circuit devices as recited in claim 5 wherein the processor is further configured to automatically coordinate creation of customized packets of information for distribution to systems coupled to the system.

10. A system for tracking status of integrated circuit devices as recited in claim 5 wherein the product tracker causes testing to be performed on the integrated circuit devices when the integrated circuit devices reach predefined stages in the manufacturing process.

11. A system for tracking status of integrated circuit devices as recited in claim 5 wherein the processor is further configured to generate customized data reports in response to specific data requests in near real-time.

12. A system for tracking status of integrated circuit devices as recited in claim 11 wherein the processor is further configured to generate the customized data reports online in near real-time.

13. A system for tracking status of integrated circuit devices as recited in claim 11 wherein the processor is further configured to generate the customized data reports in printed format in near real-time.

14. The system for tracking status of integrated circuits as recited in claim 5 including an output device provided to output the information regarding the manufacturing status of integrated circuit devices in near real-time.

15. An apparatus for coordinating and transmitting in real-time manufacturing status and condition information regarding integrated circuit devices during processing of the integrated circuit devices at remotely located facilities, using a system comprising a plurality of tracking systems, a memory arrangement and at least one processing unit coupled to the memory arrangement and tracking system, the apparatus comprising:

means for tracking each individual integrated circuit device during the processing of the integrated circuit devices in order to determine its status and condition;

means for receiving and storing in real-time information regarding the status and condition of the integrated devices recorded by the tracking system within each of the remotely located facilities;

means for aggregating the information regarding status and condition of the integrated circuit devices in accordance with the predefined aggregation protocol; and means for transmitting select packets of information regarding status and condition of integrated circuit devices in response to information requests from the systems coupled to the processing unit.

* * * * *